(12) United States Patent
Doyle et al.

(10) Patent No.: US 6,238,482 B1
(45) Date of Patent: May 29, 2001

(54) METHOD OF PRODUCING A WAFER WITH AN EPITAXIAL QUALITY LAYER AND DEVICE WITH EPITAXIAL QUALITY LAYER

(75) Inventors: Brian S. Doyle, Cupertino; Kramadhati V. Ravi, Atherton, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/258,738

(22) Filed: Feb. 26, 1999

(51) Int. Cl.[7] ................................................. C30B 25/18
(52) U.S. Cl. .................... 117/108; 117/109; 117/915; 117/954; 148/33.3
(58) Field of Search ..................................... 117/915, 934, 117/108, 109; 148/33.3

(56) References Cited

U.S. PATENT DOCUMENTS

| | | | | |
|---|---|---|---|---|
| 4,837,182 | * | 6/1989 | Bozler et al. | 117/915 |
| 5,198,371 | * | 3/1993 | Li | 437/11 |
| 5,620,557 | * | 4/1997 | Manabe et al. | 117/915 |
| 5,633,174 | * | 5/1997 | Li | 438/475 |
| 5,877,070 | * | 3/1999 | Goesele et al. | 438/458 |
| 5,891,769 | * | 4/1999 | Liaw et al. | 438/167 |

* cited by examiner

Primary Examiner—Robert Kunemund
(74) Attorney, Agent, or Firm—Blakely, Sokoloff, Taylor & Zafman LLP

(57) ABSTRACT

A method of making a wafer is provided. A first semiconductor film is formed onto a semiconductor substrate. An epitaxial film is formed onto an epitaxial wafer. The epitaxial wafer is placed with the epitaxial film on the first semiconductor film. The epitaxial film is debonded from the EPI wafer. The epitaxial film is bonded to the first semiconductor film.

23 Claims, 4 Drawing Sheets

METHOD OF PRODUCING A WAFER WITH AN EPITAXIAL QUALITY LAYER AND DEVICE WITH EPITAXIAL QUALITY LAYER

BACKGROUND OF THE INVENTION (1) Field of the Invention

The present invention is related to semiconductor fabrication. More specifically the present invention is related to fabrication of epitaxial (EPI) quality wafers.

(2) Background Information

Epitaxial (EPI) quality wafers (hereinafter referred to as "EPI wafers") are well-known in the art. The term "epitaxial" is defined as the growth of a single-crystal semiconductor film upon a single-crystal substrate. An epitaxial layer has the same crystallographic characteristics as the substrate material. The single-crystalline epitaxial structure comes about when silicon atoms are deposited on a bare silicon wafer in a Chemical Vapor Deposition ("CVD") reactor. When chemical reactants are controlled and the system parameters are set correctly, the depositing atoms arrive at the wafer surface with sufficient energy to move around on the surface and orient themselves to the crystal arrangement of the wafer atoms.

EPI wafers typically include a substrate of a heavily doped silicon onto which a layer of approximately 1 to 3 microns is epitaxially grown. FIG. 1 illustrates a cross sectional view through an EPI wafer onto which a transistor 105 (shown within dotted lines) is built. Transistor 105 has a gate 106 formed on EPI layer 104 and active regions 108 and 110 formed into EPI layer 104. The EPI wafer includes a heavily doped silicon substrate 102 on which an epitaxial low doped layer 104 of 1–3 micrometers is grown. EPI layer 104 by definition has a low doping which makes it very desirable for building transistors. Layer 104's low doping leads to substantial reduction in the transistor's junction capacitances $C_1$ and $C_2$. Typically, the smaller the junction capacitances of a transistor, the faster the transistor is. Because junction capacitances are proportional to the doping of layer 104, junction capacitances $C_1$ and $C_2$ are relatively low.

While EPI layers present the advantage explained above in connection with their lower doping, EPI wafers are very costly. Conventional EPI wafers may run up to approximately $200.00. Moreover, while several methods have been proposed to obtain EPI wafers at a cheaper cost, the proposed methods are limited to providing transistors out of EPI layers that have thicknesses smaller than 1 micrometer. EPI layers having thicknesses of less than 1 micrometer cause the transistors fabricated onto these layers to be limited in performance as these transistors have relatively large junction capacitances. The large junction capacitances are due, mainly, to the fact that as the EPI layer is thin, the junction capacitances extend in the heavily doped substrate.

SUMMARY OF THE INVENTION

An embodiment of the present invention includes a method of making a wafer. A first semiconductor film is formed onto a semiconductor substrate. An epitaxial film is formed on an epitaxial wafer. The epitaxial wafer is placed with the epitaxial film on the first semiconductor film. The epitaxial film is debonded from the epitaxial wafer. The epitaxial film is bonded to the first semiconductor film.

BRIEF DESCRIPTION OF THE DRAWINGS

The features, aspects, and advantages of the present invention will become more fully apparent from the following detailed Description, appended claims, and accompanying drawings in which:

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

One embodiment of the present invention includes a method of producing a wafer with an epitaxial-quality layer. A first semiconductor film is formed onto a heavily doped semiconductor substrate. An epitaxial (EPI) film is formed onto an EPI wafer. The EPI wafer is placed with the EPI film on the first semiconductor film. The EPI film is debonded from the EPI wafer. The EPI film is bonded to the first semiconductor film. A transistor is formed onto the EPI film. The junction capacitances of this transistor are not formed in the heavily doped substrate, but rather in the EPI film above the first semiconductor film. Due to its lack of doping or light doping, the first semiconductor film does not cause the junction capacitances to be large.

Figure 1:
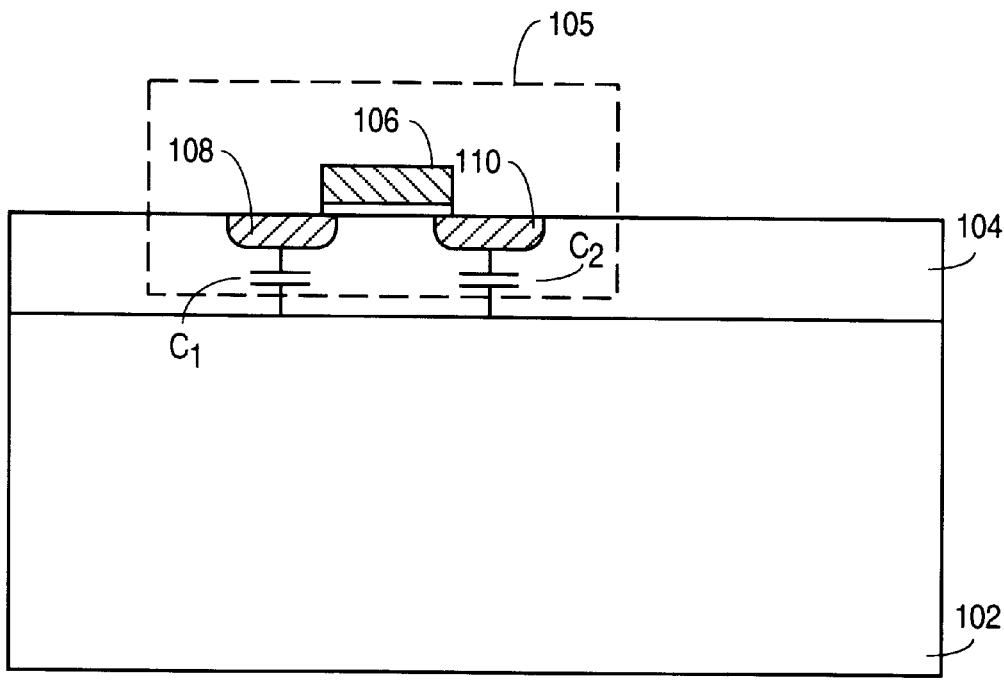
FIG. 1 illustrates in block diagram form, a cross sectional view through an epitaxial-quality (EPI) wafer onto which a transistor is built.
Figure 2:
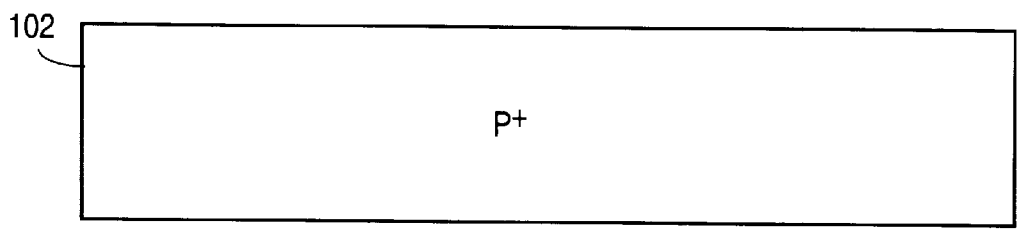
FIG. 2 illustrates a cross sectional view through a semiconductor substrate utilized in the embodiment of the method of fabricating a wafer according to the present invention.

FIGS. 2–7 illustrate cross-sectional views through several structures related to the fabrication of a wafer according to one embodiment of a method of the present invention. FIG. 2 illustrates a heavily doped semiconductor substrate 102. In one embodiment, the concentration of the doping of semiconductor substrate 102 is typically larger than $10^{18}/cm^3$. Also, in one embodiment according to the present invention, the heavily doped semiconductor substrate 102 is a P+ heavily doped silicon substrate, but the present invention is not limited in scope to the use of a P+ heavily doped silicon substrate.

Figure 3:
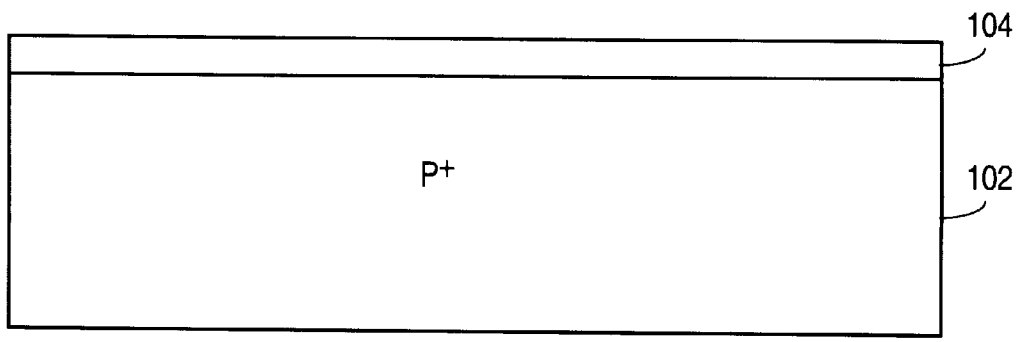
FIG. 3 illustrates a cross sectional view showing a film deposited over the semiconductor substrate according to one embodiment of the method of fabricating a wafer of the present invention.

A semiconductor film 104 is deposited over the heavily doped semiconductor substrate 102 as illustrated in FIG. 3.

Semiconductor film 104 may be not doped at all or just lightly doped such that when doped lightly its doping is substantially lower than a doping of the heavily doped substrate 107. In one embodiment, the doping of film 104 is lower than $10^{15}/cm^3$. Also, in one embodiment of the present invention, semiconductor film 104 includes polysilicon. The deposition of polysilicon film 104 may be performed by way of a chemical vapor deposition (CVD) process which is well-known in the art. Polysilicon film 104 may have a thickness of approximately 2 micrometers. However, depending on the desired thickness of the film that will be finally formed on top of the heavily doped semiconductor substrate 102, the thickness of polysilicon film 104 may be ranging from a little over 0 to approximately 2 micrometers, although 2 micrometers is not limiting. Layer 104 may be alternatively made of a polysilicon amorphous semiconductor material.

Figure 4:
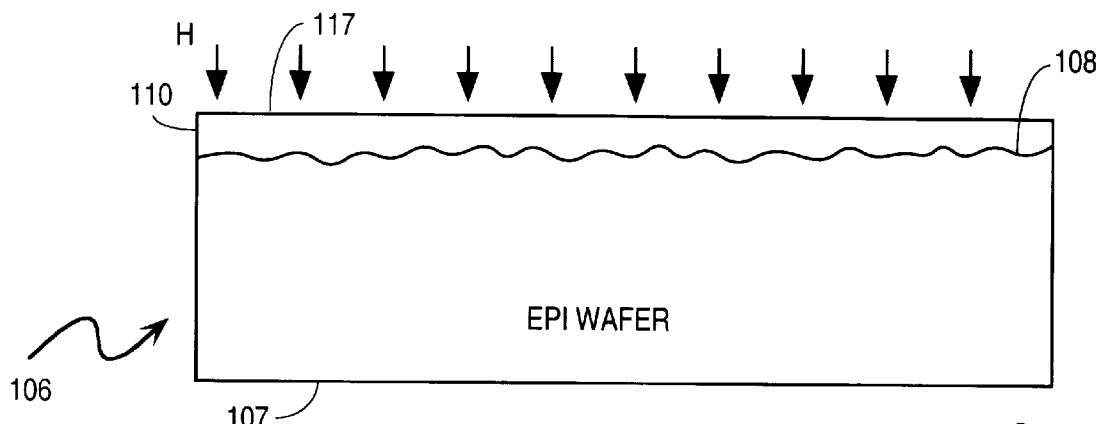
FIG. 4 illustrates a cross-sectional view through an epitaxial (EPI) wafer subjected to a process of ion implantation, utilized in the embodiment of the method of fabricating a wafer according to the present invention.

FIG. 4 illustrates a cross-sectional view through an (EPI) wafer 106. The EPI wafer 106 is subjected to a process of hydrogen implantation. Hydrogen ions, having a concentration in a range of approximately $5\times10^{16}$–$10^{17}/cm^2$, are used to implant (bombard) the EPI wafer 106. The implantation of hydrogen ions causes a damaged surface 108 in the EPI wafer 106 close to top surface 117 of EPI wafer 106. The damaged surface 108 and top surface 117 of EPI wafer 106 defines an embrittled EPI film 110 that may later be bonded to the structure having the cross-section illustrated in FIG. 3. The embrittled EPI film 110 has a thickness of approximately 1 micrometer, but the present invention is not limited in scope to this value for the thickness of EPI film 108. A combined thickness of the first film and of the EPI film has a size such that a junction capacitance, of Metal Oxide Semiconductor Field Effect Transistor (MOSFET) formed onto the EPI film, extends no further than the EPI film and the first film.

Figure 5:
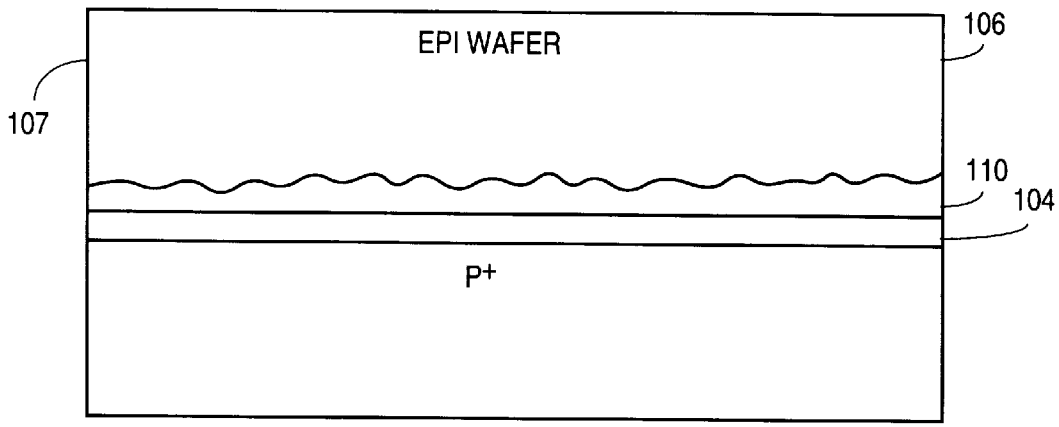
FIG. 5 illustrates a cross-sectional view through a structure that includes the EPI wafer with an embrittled EPI film placed with the embrittled EPI film onto the semiconductor film of the first semiconductor substrate.
Figure 6:
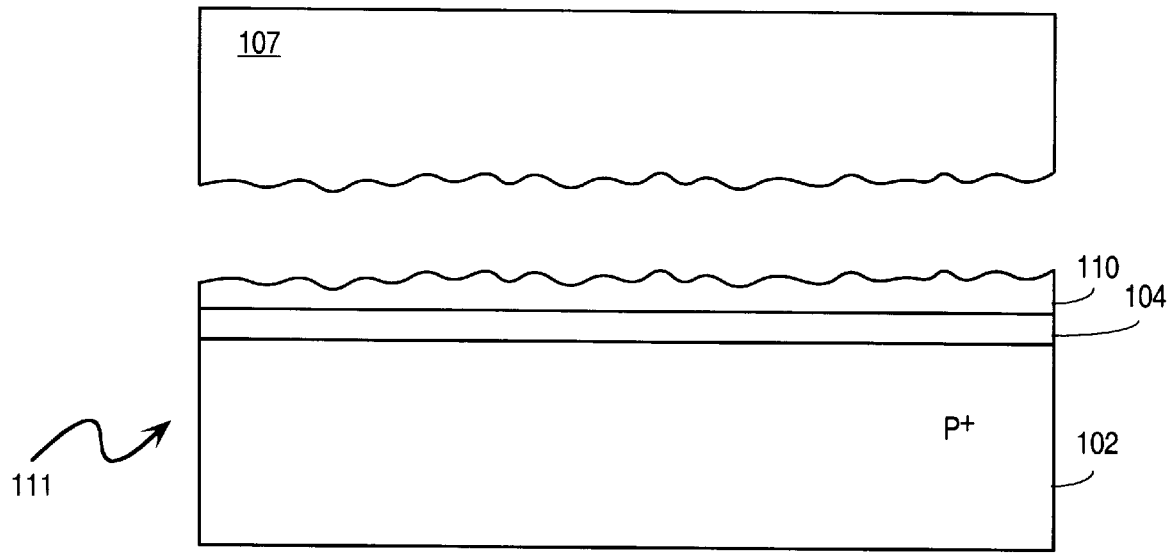
FIG. 6 illustrates the remaining EPI wafer and the embrittled EPI film bonded to the first semiconductor film.

The EPI wafer 106 with embrittled film 110 is then turned upside down and placed with embrittled semiconductor film 110 onto the first semiconductor film 104 of wafer 102 as shown in FIG. 5. The assembly of FIG. 5 is then heated to a temperature that causes debonding of the remaining part 107 of EPI wafer 106 from the embrittled EPI film 110 as shown in FIG. 6. In one embodiment of the method of the present invention the temperature utilized for causing the above-mentioned debonding is approximately 400° C. The structure of FIG. 6 is further heated to a temperature that causes bonding of epitaxial film 110 to first semiconductor film 104. Such temperature may be approximately 800° C.

Figure 7:
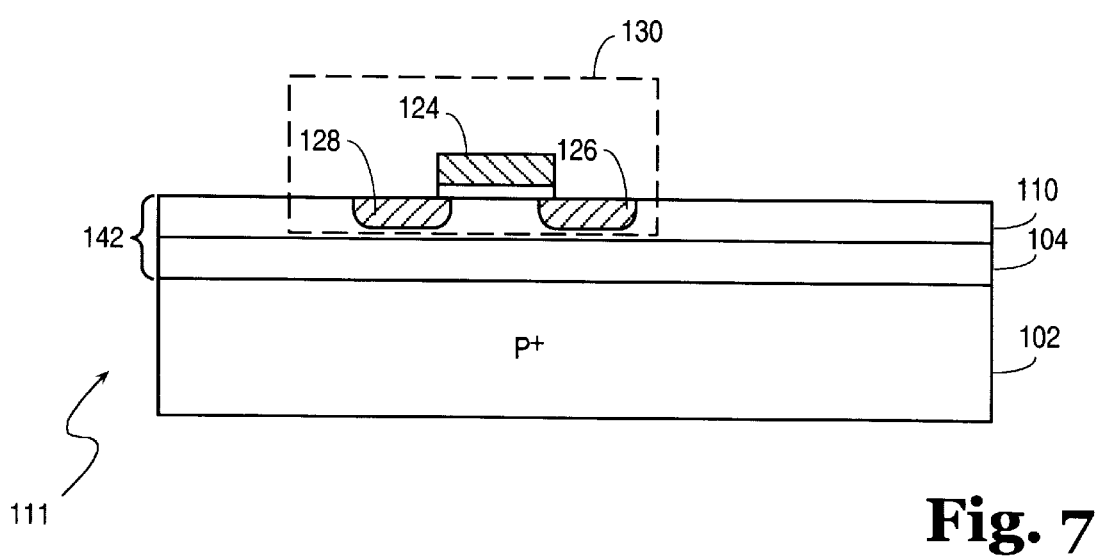
FIG. 7 illustrates the first semiconductor substrate with the first semiconductor film and the epitaxial film bonded to the first semiconductor film with a transistor formed in the epitaxial film.

The structure 111, including epitaxial film 110 bonded to first film 104, of the semiconductor substrate 102, is then planarized by way of a well-known Chemical Mechanical Polishing (CMP) process. The net result is a heavily doped substrate P+ 102 with a layer 142 including the two films 110 and 104. After the CMP process, an active device such as a transistor 130 may be built onto the structure 111 as illustrated in FIG. 7. Transistor 130 (shown within dotted lines) has a gate 124 formed on top of film 110 and active region 126 and 128 formed in the epitaxial film 110. The amorphous silicon layer or polysilicon layer 104 is typically not doped such that the junction capacitances of transistor 130 are relatively low.

Layer 142 has a thickness greater than 1 micrometer. This causes the junction capacitance of transistor 130 to be formed mostly in the epitaxial film 110 and in the undoped amorphous silicon or polysilicon film 104. The thickness of layer 142 which is in the range of approximately 1–3 $\mu$m provides a medium thick enough to prevent the formation of junction capacitances in a medium that includes heavily doped substrate 102.

Figure 8:
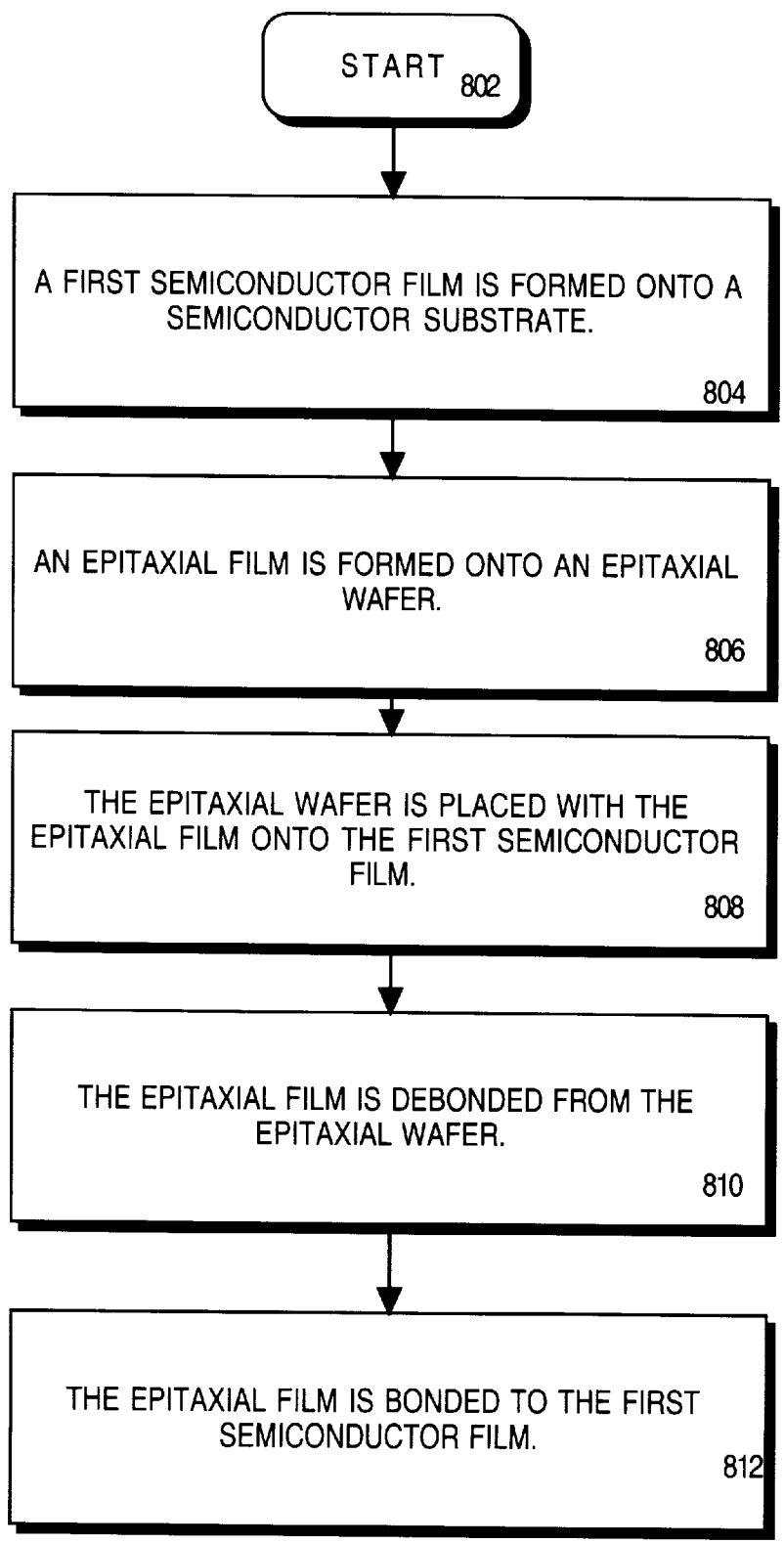
FIG. 8 illustrates a flow chart diagram in connection with the embodiment of a method of fabricating a wafer according to the present invention.

FIG. 8 illustrates a flow chart diagram in connection with the embodiment of a method of fabricating a wafer according to the present invention. The method starts at step 802 from where it passes to block 804. At block 804 a first semiconductor film is formed onto a semiconductor substrate. The first semiconductor film is generally not doped. The method then passes to block 806 where an epitaxial film is formed onto an epitaxial wafer. The method then passes to block 808 where the epitaxial wafer is placed with an epitaxial film onto the first semiconductor film. Then next, at block 810 the epitaxial film is debonded from the epitaxial wafer. Next, at block 810, the epitaxial film is bonded to the first semiconductor film.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited by the appended claims.

What is claimed is:

1. A method of making a wafer, the method comprising:
   forming a first semiconductor film onto a semiconductor substrate;
   forming an epitaxial film on an epitaxial wafer;
   placing said epitaxial wafer with said epitaxial film on said first semiconductor film;
   debonding said epitaxial film from said epitaxial wafer; and
   bonding said epitaxial film to said first semiconductor film.

2. The method of claim 1 wherein said first semiconductor film is formed onto said semiconductor substrate by chemical vapor deposition.

3. The method of claim 1 wherein said epitaxial film is embrittled.

4. The method of claim 3 wherein said epitaxial film is formed by implanting ions into the epitaxial wafer.

5. The method of claim 4 wherein said ions include Hydrogen ions.

6. The method of claim 5 wherein said Hydrogen ions have a concentration in a range of approximately $5\times10^{16}$–$10^{17}/cm^2$.

7. The method of claim 1 wherein said debonding includes heating said semiconductor substrate with said epitaxial film placed onto said first semiconductor film to a temperature of approximately 400° C.

8. The method of claim 1 wherein said bonding includes heating said semiconductor substrate with said epitaxial film to a temperature of approximately 800° C.

9. The method of claim 1 wherein a combined thickness of the first semiconductor film and of said epitaxial film has a size such that a junction capacitance of a Metal Oxide Semiconductor Field Effect Transistor (MOFSET) formed onto the epitaxial film extends no further than said epitaxial film and said first semiconductor film.

10. The method of claim 1 wherein said first semiconductor film has a thickness of approximately 2 micrometers.

11. The method of claim 1 wherein said epitaxial film has a thickness of approximately 1 micrometer.

12. The method of claim 1 wherein said first semiconductor film includes polysilicon.

13. The method of claim 1, said first semiconductor film includes an amorphous material.

14. A method of making an active device, the method comprising:

forming a first semiconductor film onto a heavily doped semiconductor substrate;

forming an epitaxial film onto an epitaxial wafer;

placing said epitaxial wafer with said epitaxial film onto said first semiconductor film;

debonding said epitaxial film from said epitaxial wafer;

bonding said epitaxial film to said first semiconductor film;

forming first and second active areas, separated by a space therebetween, into said epitaxial film; and forming a gate electrode onto said epitaxial film, said gate electrode overlying said space.

15. The method of claim 14 wherein said epitaxial film is embrittled.

16. The method of claim 15 wherein said epitaxial film is formed by implanting ions into the epitaxial wafer.

17. The method of claim 14 wherein a combined thickness of the first semiconductor film and of said epitaxial film has a size such that a junction capacitance of a Metal Oxide Semiconductor Field Effect Transistor (MOFSET) formed onto the epitaxial film extends no further than said epitaxial film and said first semiconductor film.

18. The method of claim 14, said first semiconductor film has a thickness of approximately 2 micrometers.

19. The method of claim 14, said epitaxial film has a thickness of approximately 1 micrometer.

20. A wafer comprising:

a semiconductor substrate having a first film formed on said semiconductor substrate; and an epitaxial film bonded to said first film wherein a combined thickness of said first film and of said epitaxial film has a size such that a junction capacitance of a Metal Oxide Semiconductor Field Effect Transistor (MOFSET) formed onto said epitaxial film extends no further than said epitaxial film and said first film.

21. The wafer of claim 20 wherein said combined thickness is larger than 1 micrometer.

22. The wafer of claim 20 wherein said first film include polysilicon.

23. The wafer of claim 22 wherein said first film includes an amorphous material.

* * * * *